(12) United States Patent
Wang et al.

(10) Patent No.: US 6,230,040 B1
(45) Date of Patent: May 8, 2001

(54) METHOD FOR PERFORMING MAGNETIC RESONANCE ANGIOGRAPHY WITH DYNAMIC K-SPACE SAMPLING

(75) Inventors: Yi Wang, New York; Howard M. Lee, Rye, both of NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 0 days.

(21) Appl. No.: 08/975,800

(22) Filed: Nov. 21, 1997

(51) Int. Cl.$^7$ ................................................. A61B 5/055
(52) U.S. Cl. ............................................. 600/415; 324/309
(58) Field of Search .................................. 600/410, 419, 600/420, 415; 324/306, 309

(56) References Cited

U.S. PATENT DOCUMENTS

| | | | |
|---|---|---|---|
| 5,087,880 | * | 2/1992 | Bruder et al. . |
| 5,251,628 | * | 10/1993 | Foo . |
| 5,398,686 | * | 3/1995 | Inoue et al. . |
| 5,754,046 | * | 5/1998 | Busch et al. . |
| 5,879,299 | * | 3/1999 | Posse et al. . |
| 5,892,358 | * | 4/1999 | King . |
| 5,912,557 | * | 6/1999 | Wilman et al. . |
| 5,924,987 | * | 7/1999 | Meany et al. . |
| 5,928,148 | * | 7/1999 | Wang et al. . |

OTHER PUBLICATIONS

Gadolinium optimized tracking technique: A new MRA technique for imaging the peripheral vascular tree form aorta to the foot using one bolus of gadolinium. Proc. ISMRM, p. 203, 1997; K.Y. Ho, et al.*
An Optimal Phase Encoding Order for Minimizing Motion Artifact and Maximizing Arterial Contrast in 3D Contrast–Enhanced MR Angiography, Proc. ISMRM, p. 252, 1997; Alan H. Wilman, et la.*
Bolus–Chase MR Digital Subtraction Angiography in the Lower Extremity; Radiology, 1998; 207:263–269; Yi Wang, et al., Apr. 1998; vol. 207, No. 1; pp. 164–269.*
Improved Centric Phase Encoding Orders for Three–Dimensional Magnetization–Prepared MR Angiography; MRM 36:384–392 1996; Alan H. Wilman, et al.*
Dynamic k–space Filling for Bolus Chase 3D MR Digital Subtraction Angiography, MRM 40:99–104 (1995), Howard M. Lee, Yi Wang.*

* cited by examiner

Primary Examiner—Marvin M. Lateef
Assistant Examiner—Shawna J. Shaw
(74) Attorney, Agent, or Firm—Quarles & Brady, LLP

(57) ABSTRACT

MRA data is acquired from a large region of interest by translating the patient to successive stations at which successive portions of the three-dimensional MRA data set are acquired. Patient movement is chosen to track a bolus of contrast agent as it passes through the region of interest and a 3D acquisition is performed at a succession of stations. The order and shape in which k-space is sampled differs from station-to-station to achieve maximum image contrast.

9 Claims, 7 Drawing Sheets

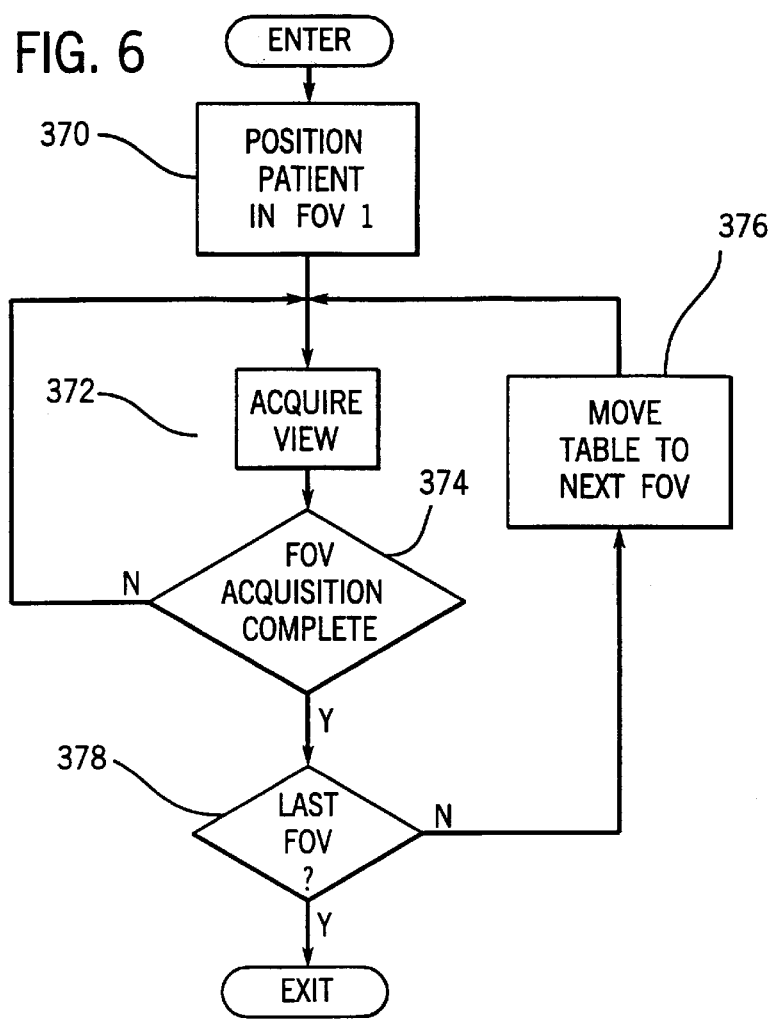
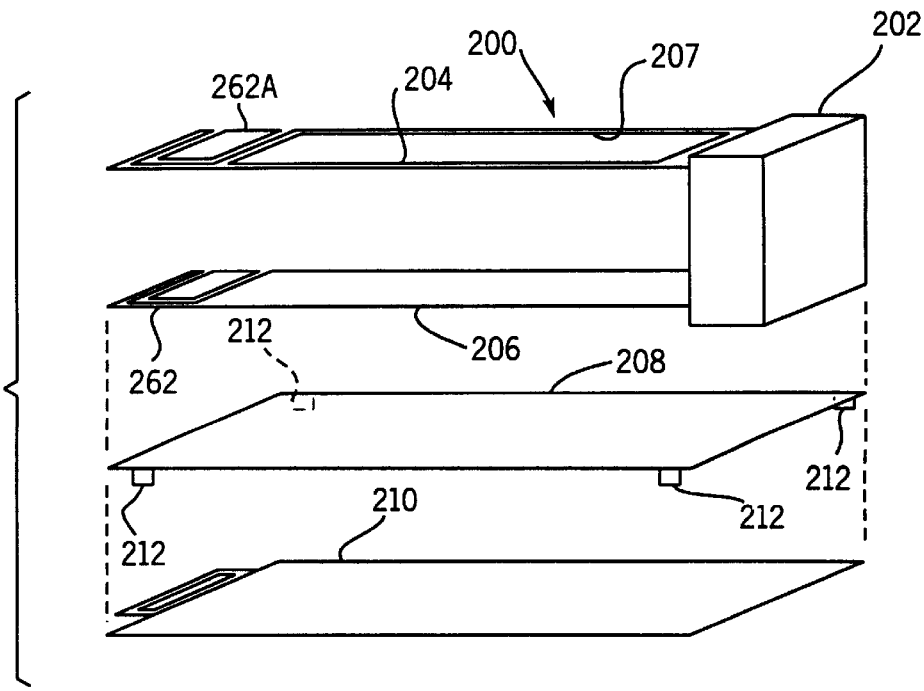

METHOD FOR PERFORMING MAGNETIC RESONANCE ANGIOGRAPHY WITH DYNAMIC K-SPACE SAMPLING

BACKGROUND OF THE INVENTION

The field of the invention is magnetic resonance angiography ("MRA"), and particularly, studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Images showing the circulation of blood in the arteries and veins of the kidneys, the neck and head, the extremities and other organs have immense diagnostic utility. Unfortunately, however, these x-ray methods subject the patient to potentially harmful ionizing radiation and often require the use of an invasive catheter to inject a contrast agent into the vasculature to be imaged. There is also the issue of increased nephro-toxicity and allergic reactions to iodinated contrast agents used in conventional x-ray angiography.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in magnetization saturation that exist between flowing blood and stationary tissue. Flowing blood, which is moving through the excited section, is continually refreshed by spins experiencing fewer excitation pulses and is, therefore, less saturated. The result is the desired image contrast between the high-signal moving blood and the low-signal stationary tissues.

MRA methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images.

To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM*, p203, 1997. As described in U.S. Pat. No. 5,928,148 issued on Jul. 27, 1999 and entitled "Method For Performing Magnetic Resonance Angiography Over A Large Field of View Using Table Stepping," bolus chase techniques employ a stepping table and an imaging strategy that allows imaging location synchronized to the location of peak contrast enhancement. As the contrast bolus transits through the lower extremity, images encompassing the entire lower extremity are acquired. Mask subtraction is used to suppress background and produce angiograms. Both 2D and 3D fast gradient echo sequences can be used to acquire data. 2D bolus chase MRA offers high in-plane resolution and a fast frame rate. Using 2D MRA, the entire lower extremity can be imaged with a small dose of gadolinium. But 2D acquisition lacks depth resolution, which may be required for depiction of vascular bifurcations, such as in the aorta, iliac and femoral arteries. The depth information can be obtained with additional 2D projections or a 3D acquisition. In prior bolus chase 3D MRA studies, a long acquisition time (2 min) is required and consequently, a large contrast dose (40 mL) is used to maintain the contrast at peak level over the entire scan time. In addition, long acquisition times may result in venous enhancement in the distal station, due to venous return at the calf and ankle, which makes interpretation of the images difficult.

SUMMARY OF THE INVENTION

The present invention is a method for acquiring NMR data from a large region of interest by acquiring NMR data from a series of smaller fields of view which collectively span the large region of interest. The patient is automatically translated, or stepped, to a new position within the bore of the magnet by moving the patient table between the acquisition of each field of view. To enhance the image, a contrast agent is injected in the patient and flows through the successive fields of view. To take maximum advantage of the contrast agent, the order in which k-space sampling is performed to acquire each field of view is changed. For the first field of view a descending sampling order is used and for the final field of view an ascending sampling order is used. An edge-center-edge sampling order is used for intermediate fields of view. To shorten acquisition time at each field of view, partial k-space sampling tailored to each field of view is performed.

A general object of the invention is to obtain maximum image contrast in a bolus tracking MRA scan. Even when using a 3D acquisition which does not enable the bolus of contrast agent to be tracked fast enough as it travels through successive fields of view, contrast enhancement is achieved by judiciously changing the k-space sampling order to sample the center of k-space at peak contrast. This is accomplished by delaying the sampling of central k-space during the acquisition of the first field of view and by sampling central k-space early during the acquisition of the last field of view.

Another general object of the invention is to shorten the acquisition time at each field of view during a bolus tracking MRA scan. The acquisition time at each field of view is reduced without loss of SNR and spatial resolution by using a partial k-space sampling which is tailored to the particular anatomy at each field of view. With this method, the outer edge of k-space with less image signal contribution is undersampled, and this undersampling is tailored along both the slice encoding and phase encoding directions to minimize artifacts at each field of view.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 6 is a flow chart of the sequence of steps performed by the MRI system of FIG. 1 to practice the preferred embodiment of the invention;

FIG. 7 is an exploded view of the supporting structure for a local RF coil used to practice the preferred embodiment;

DESCRIPTION OF THE PREFERRED EMBODIMENT

Figure 1:
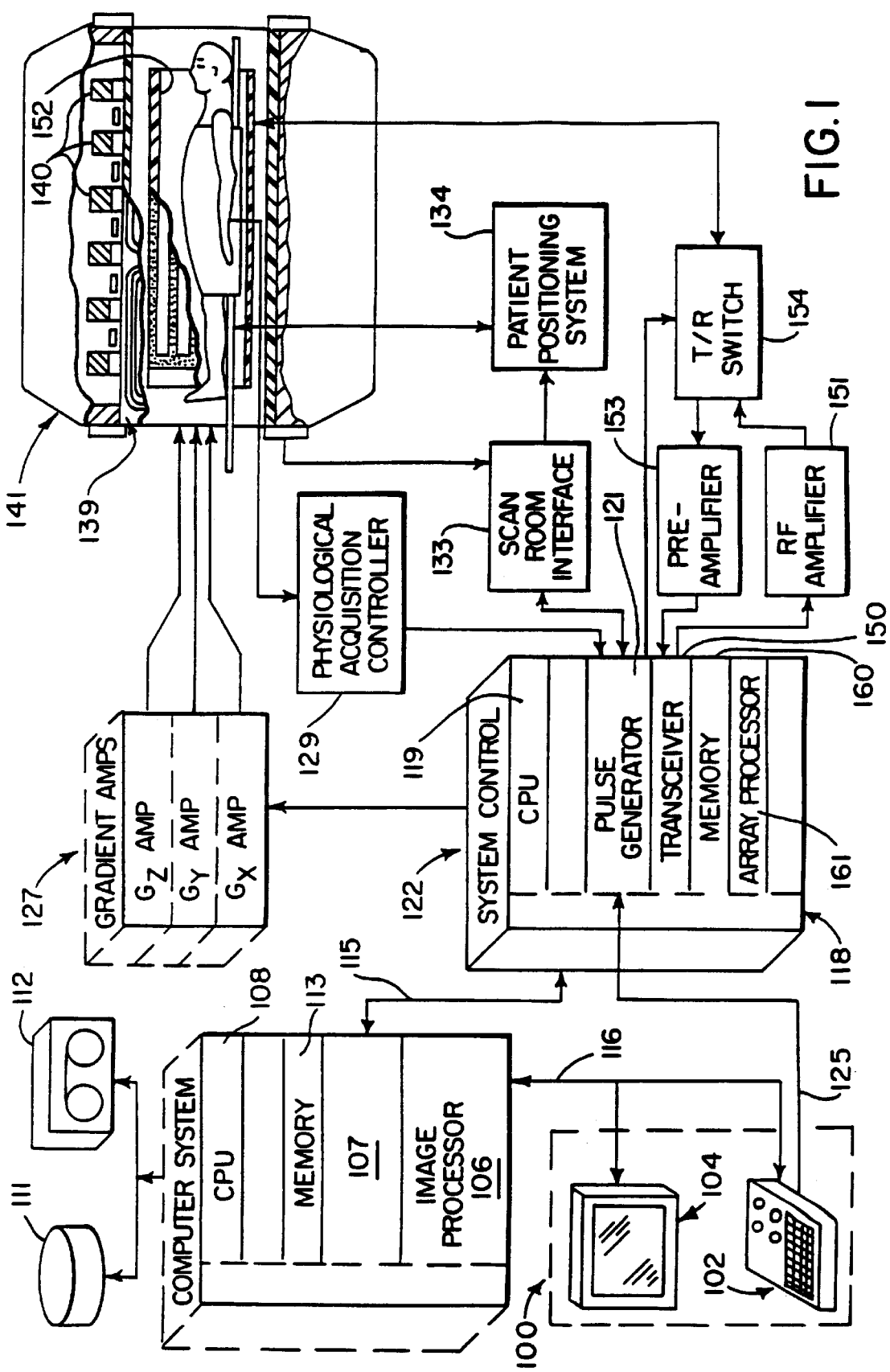
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands from the pulse generator module 121 to move the patient to the sequence of desired positions to perform the scan in accordance with the present invention. The operator can thus control the operation of the patient positioning system 134 through the keyboard and control panel 102.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF local coil to be used during the receive mode. In the preferred embodiment of the invention a single, stationary local coil described below and shown in FIG. 7 is switched into operation. In the alternative, a multi-segment local coil described below and shown in FIG. 8 may also be used. In this case, the separate segments of the local coil are switched into operation by the transmit/receive switch 154 as the patient is translated to successive stations during the scan.

The NMR signals picked up by the RF local coil are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
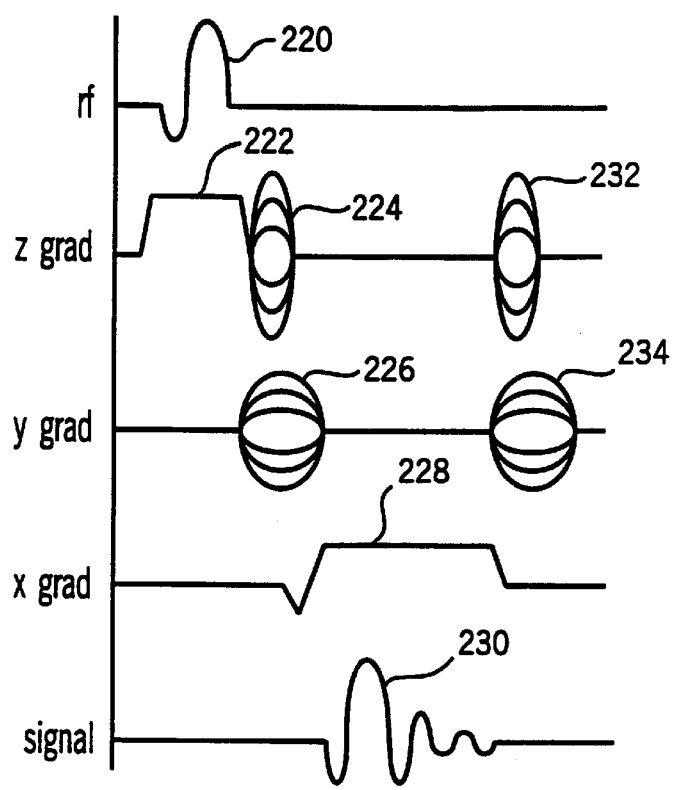
FIG. 2 is a graphic representation of a pulse sequence performed by the MRI system of FIG. 1 to practice a preferred embodiment of the invention.

While many pulse sequences may be used to practice the present invention, in the preferred embodiment a 3D gradient-recalled echo pulse sequence is used to acquire the NMR data. Referring particularly to FIG. 2, an RF excitation pulse 220 having a flip angle of 45° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 are applied to rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space in the field of view. As will be described in more detail below, it is the order and the extent to which these phase encoding gradients are stepped, and hence the order and shape in which k-space is sampled, which is the subject of the present invention. In the preferred embodiment 32 phase encodings are employed along the z axis and 256 phase encodings are employed along the y axis for a full sampling of k-space. Sampling along the $k_x$ axis is performed by sampling the echo signal 230 in the presence of the readout gradient pulse 228 during each pulse sequence. It will be understood by those skilled in the art that only a partial sampling along the $k_x$ axis may be performed and the missing data is computed using a homodyne reconstruction or by zero filling. This enables the echo time (TE) of the pulse sequence to be shortened to 1.0 ms and the pulse repetition rate (TR) to be shortened to 4.5.

Figure 3:
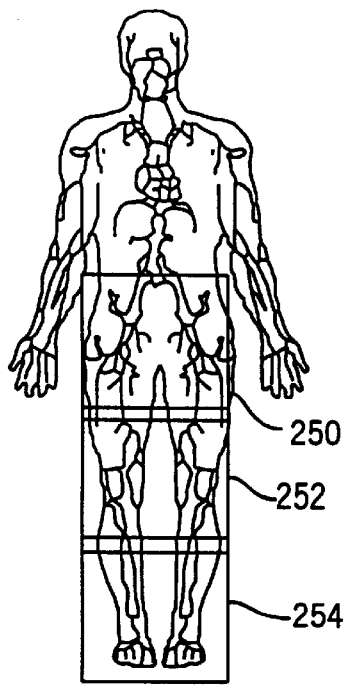
FIG. 3 is a pictorial representation of a patient illustrating a region of interest comprised of three overlapping fields of view.
Figure 4:
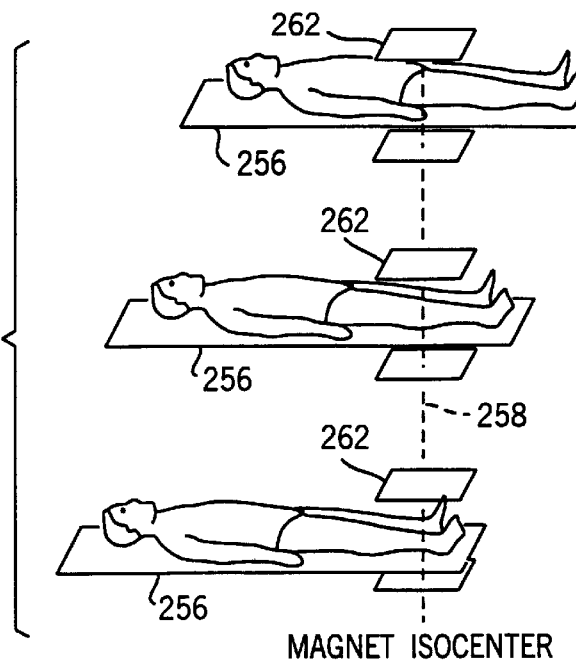
FIG. 4 is a pictorial representation of a patient within the bore of the MRI system of FIG. 1 to acquire the three fields of view shown in FIG. 3.

Referring to FIG. 3, an examination of the vasculature of a patient's legs can be performed by dividing up the region of interest into three overlapping fields of view indicated at 250, 252 and 254. As shown in FIG. 4, this is accomplished by moving a patient table 256 to three successive locations, or stations, within the bore of the magnet to align the respective centers of the field of view with the isocenter 258 of the MRI system. A local RF coil 262 such as a 4-coil array consisting of anterior and posterior subunits is positioned at the system isocenter and it remains stationary as the patient is translated by the table 256 to three different stations. At each station of the table 256 the pulse sequence of FIG. 2 is employed to acquire NMR data from which an image of the field of view may be reconstructed.

As shown in FIG. 7, a coil holder 200 has a closed end 202 which is attached to the carriage cover of the MRI system and supports an upper plate 204 and lower plate 206 which extend into the bore of the magnet. The end of the upper plate 204 supports the upper RF coil unit 262A which rests on the patient and slides smoothly over the patient during table translation. A rectangular opening 207 in the upper plate 204 provides space for the patient's feet. The lower plate 206 supports the lower RF coil unit 262B on its outer end which is positioned beneath the patient. The patient lies on an elevated table 208 and the lower plate 206 extends beneath the elevated table 208. The elevated table 208 rests on the sliding table 210 in the MRI system and is spaced therefrom by legs 212 to provide space for the lower plate 206. The patient may thus be translated between the RF coil units 262A and B which remain stationary at the system isocenter and in close proximity for optimal signal reception at all table stations.

Figure 8A:
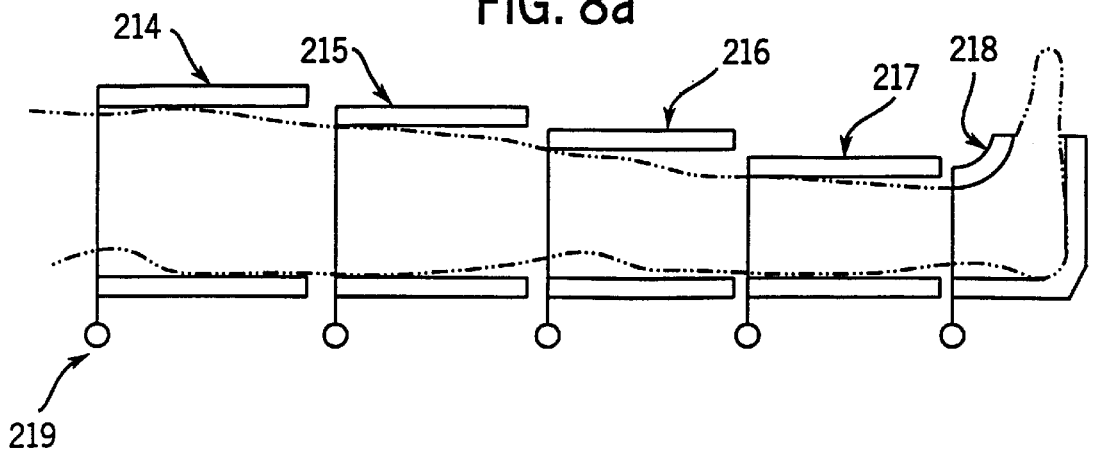
FIGS. 8a and 8b are a schematic diagrams of a multi-segment local coil used in an alternative embodiment of the invention.
Figure 8B:
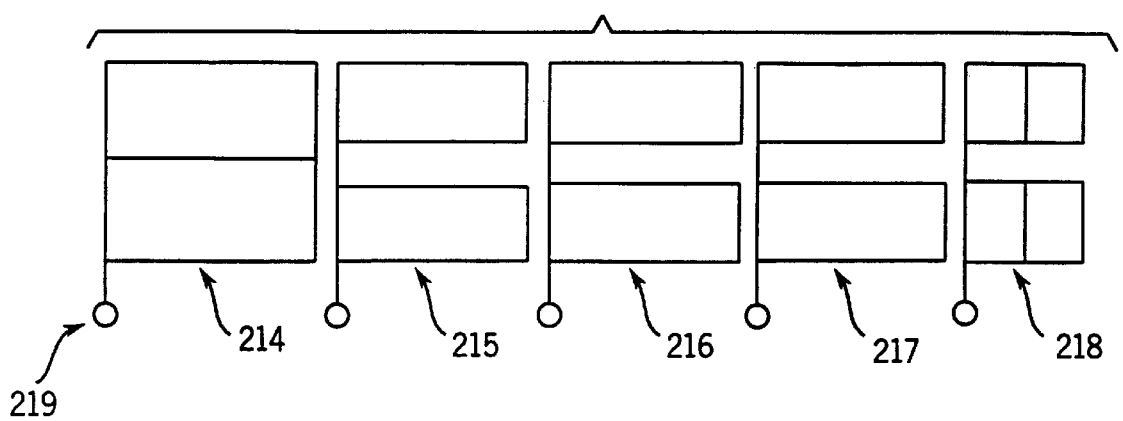

An alternative local coil structure which moves with the patient may also be used. Referring to FIGS. 8A and 8B, this alternative local coil is a coil array comprised of five coil segments 214–218, each comprised of four coil elements. The coil segments 214–218 are positioned on the patient and distributed along the entire region of interest to be imaged—in this case, the legs and feet. The coil elements are supported by fabric (not shown) which is sewn into a pant-like garment that clothes the patient's legs.

Each coil segment 214–218 has four coil elements that acquire NMR data from the FOV. Two of the coil elements are positioned on top, or anterior, of the lower extremity as seen in FIG. 8B, and the other two elements are positioned below, or posterior, of the lower extremity. The coil elements connect together to form one of the coil segments 214–218, and each is separately connected through terminals 219 to the above-described transmit/receive switch 154. Coupling between coil segments 214–218 is of little concern, because only one segment is operative at any moment during the scan. As the patient is translated to bring the successive coil segments 214–218 into the FOV of the MRI system, the aligned coil segment is connected to the system transceiver module 150. MRA data is acquired using that coil segment and the patient is then translated to the next station and the next coil segment is enabled.

The multi-element coil segments may be constructed using a number of well-known methods. Coupling between the separate coil elements is minimized to increase the SNR of the data acquired using the coil segment. Such decoupling is achieved using the methods taught in U.S. Pat. No. 4,825,162 issued to Roemer, et al., and entitled "Nuclear Magnetic Resonance (NMR) Imaging With Multiple Surface Coils" or U.S. Pat. No. 4,721,913 issued to Hyde, et al. and entitled "NMR Local Coil Network".

Figure 9:
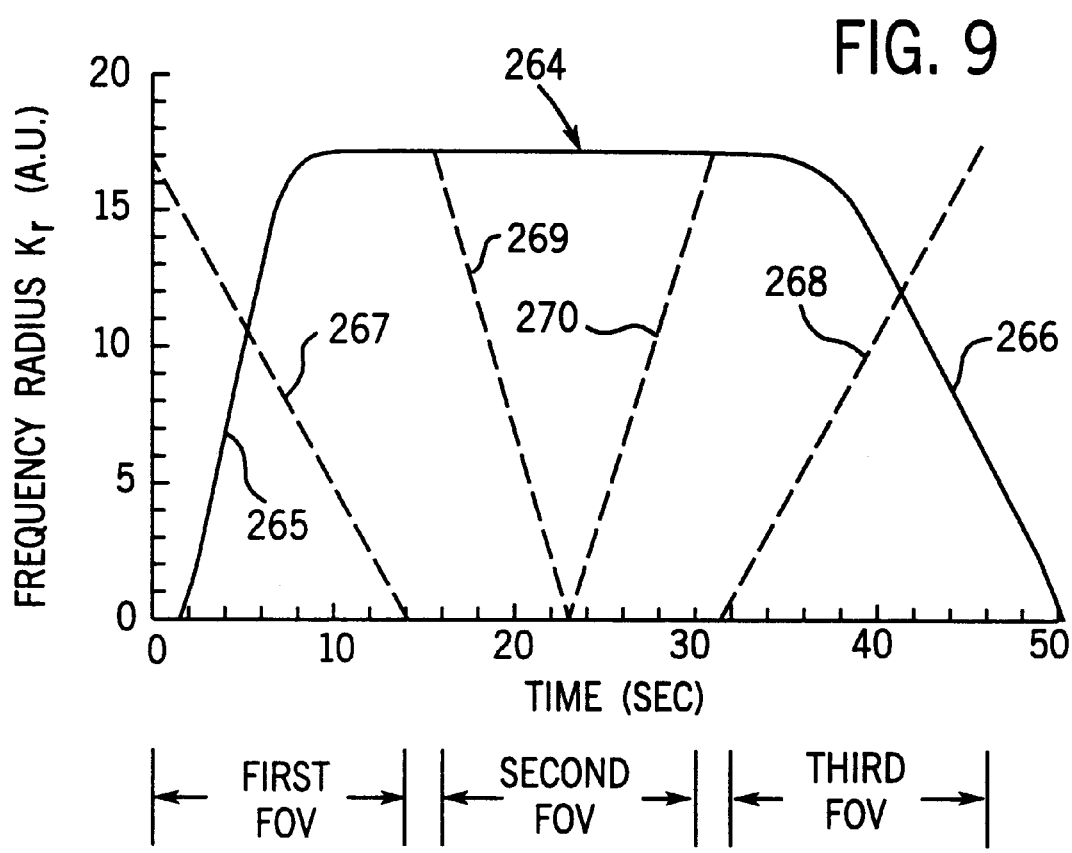
FIG. 9 is a graphic representation of three k-space sampling orders used in the process of FIG. 6.

When a 3DFT acquisition is performed at each FOV, the successive acquisitions may not be fast enough to track with the bolus of contrast agent as it passes through successive FOVs. In the example shown in FIG. 9, it may require nearly 50 seconds to acquire 3D NMR data from three FOVs, and the contrast indicated by curve 264 may be at peak level for only 30 seconds. During the acquisition of the first FOV, the contrast is increasing as indicated at 265 and is peak only during the final moments of the acquisition. On the other hand, during the acquisition of the third FOV the contrast is declining as indicated at 266, and is peak only during the initial part of the acquisition.

It is well known in the art that for most objects the bulk of the signal power is contained in the NMR samples taken near the origin of ($k_y$, $k_z$) space, and it is these samples which contribute most significantly to the appearance of the reconstructed image. This results from the fact that the NMR signals acquired during the scan are Fourier transformed along the $k_x$, $k_y$, $k_z$ directions to produce intensity values for an image in real (x,y,z) space. It is the nature of this transformation that the samples near the origin ($k_y=0$, $k_z=0$), or the central part of k-space, contribute a disproportionate share to the signal power of the reconstructed image. Accordingly, it is a basic idea of this invention that the sampling orders for each FOV acquisition be selected to sample the central region of k-space when the contrast is at its peak value.

Referring again to FIG. 9, if the distance from the center of k-space ($k_y=0$, $k_z=0$) is represented by the frequency radius $$k_r = \sqrt{k_y^2 + k_z^2},$$

each of the three FOVs is sampled in a different order. The first FOV is sampled in a descending sampling order indicated by dashed line 267 in which the peripheral views of k-space (i.e. large $k_r$) are sampled first and the central views of k-space (i.e. small $k_r$) are sampled last. As a result, the central part of k-space is sampled later in the FOV acquisition when the contrast 264 is at peak value. On the other hand, the third FOV is sampled in an ascending sampling order indicated by dashed line 268 in which the central views of k-space are sampled first and the peripheral views of k-space are sampled last. This sampling order is also known in the art as "centric view order" and the preferred method used herein is described in U.S. Pat. No. 5,122,747 which is incorporated herein by reference. As a result of the ascending sampling order, the central part of k-space is sampled early in the acquisition of the third FOV while the contrast 264 is still at its peak.

The sampling order of the second FOV is not as critical since the contrast 264 is at peak value throughout the acquisition. However, in the preferred embodiment an edge-center-edge sampling order is used. The first half of the acquisition indicated by dashed line 269 samples k-space using a descending sampling order, but alternate $k_y$, $k_z$ samples are skipped. For example, odd numbered elements are sampled and even numbers are skipped. Once the center of k-space is reached, data acquisition continues using an ascending order in which the skipped samples (e.g. even numbered samples) are acquired. This is indicated by the dashed line 270 in FIG. 9. The advantage of this edge-center-edge sampling order is that the central portion of k-space is sampled in a temporally compact portion of the acquisition, minimizing possible motion artifacts.

As shown in FIG. 6, the scan is performed under the direction of a stored program which directs the pulse generator module 121 to carry out a sequence of steps. As indicated by process block 370, the pulse control module 121 sends command signals to the patient positioning system 134 which moves the table to align the first FOV at the system isocenter 258. A loop is then entered in which NMR data is acquired for a complete image. More specifically, the pulse control module 121 directs the MRI system to perform the pulse sequence of FIG. 2 to acquire one view of NMR data as indicated at process block 372. Phase encodings are stepped as described above and additional views are acquired until the desired k-space has been sampled and the acquisition is complete as determined at decision block 374. During the acquisition of the first FOV, k-space is sampled in descending order such that the center of k-space is sampled at the end of the acquisition.

At the completion of the first image acquisition the pulse control module 121 commands the patient positioning system 134 to move the table 256 to the next station to align the next field of view at the system isocenter 258 as indicated at process block 376. In the preferred embodiment this distance is 25 cm. Another image is then acquired at 372 and 374. However, the order in which k-space is sampled for the next FOV is different. If it is an intermediate FOV, such as the second of three or four to be acquired, then an edge-center-edge sampling order is used. In this case the center of k-space is sampled near the middle of the acquisition and it is sampled in a short time interval to reduce motion artifacts.

This sequence of acquiring an image and moving the patient table 256 continues until the last field of view in the scan is to be acquired. During the last FOV acquisition the order in which k-space is sampled is changed to an ascending view order. The center of k-space is thus sampled early in the acquisition to obtain the maximum possible image contrast from the bolus of contrast agent. The scan is completed after the last FOV is acquired as determined at decision block 378, and image reconstruction is performed using the 3D MRA data sets acquired from each FOV.

Another aspect of the present invention is to tailor the shape and extent to which k-space is sampled at each station of the scan. In some examinations it is desired to reduce the voxel size in order to improve the quality of the maximum intensity projection (MIP) image. This requires that more k-space samples be acquired, and this requires a longer acquisition at each field of view. In order to accomplish this without reducing the size of the field of view or increasing scan time, the shape and size of the k-space sampling is tailored for each station in the scan.

Referring particularly to FIG. 10, we propose a tailored k-space acquisition approach by taking advantage of the fact that a majority of image signal is located in the center of k-space. In this tailored k-space approach, the outer edge of k-space with little image signal is undersampled, and k-space sampling along both slice (z) and phase (y) directions are tailored to the imaging application. The tailored k-space is a balance between the full k-space acquisition that acquires all high k views, and the well-known key-hole acquisition that does not acquire any high k views.

Figure 10A:
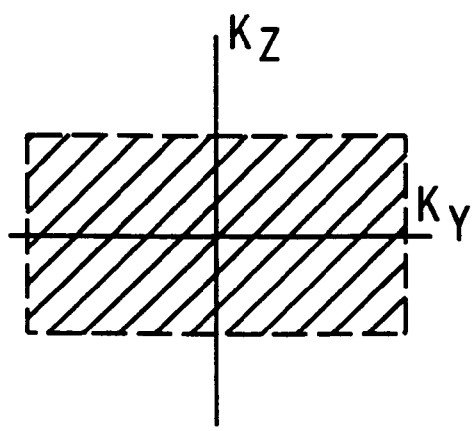
FIGS. 10a–d are graphic illustrations of four different partial k-space sampling methods used in the process of FIG. 6.

The key-hole acquisition is illustrated in FIG. 10a and it is characterized by the elimination of higher k-space samples along one phase encoding axis (i.e. the z-axis in the example). With this method only the central portion of $k_z$-space is sampled and the total acquisition time is shortened.

Such a partial sampling of k-space may not be appropriate for each field of view during the bolus tracking MRA scan.

Accordingly, it is a teaching of the present invention that not only the sampling view order be changed during the scan, but the shape and size of the k-space sampling be tailored to each field of view acquired during the scan. Three additional partial k-space sampling shapes are illustrated in FIGS. 10b–d.

Figure 10B:
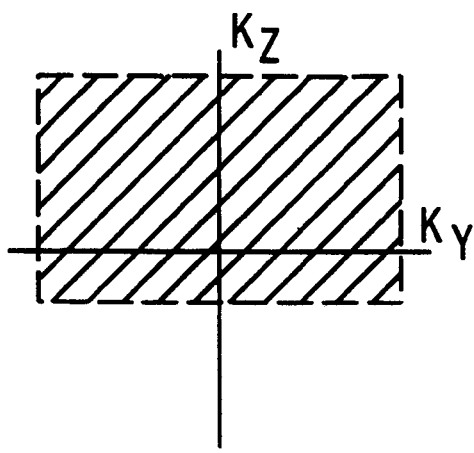

The k-space sampling shape may be asymmetrical as illustrated in FIG. 10b. Data sampling takes place primarily in the upper $k_z$-space and the lower $k_z$-space is only sampled near the center of k-space for better SNR and phase calibration. It has been shown that this asymmetric k-space sampling can provide a 19% image contrast improvement over the key-hole sampling method of FIG. 10a in certain medical applications. The unsampled lower $k_z$-space can be interpolated with phase corrected Hermitian conjugation.

Figure 10C:
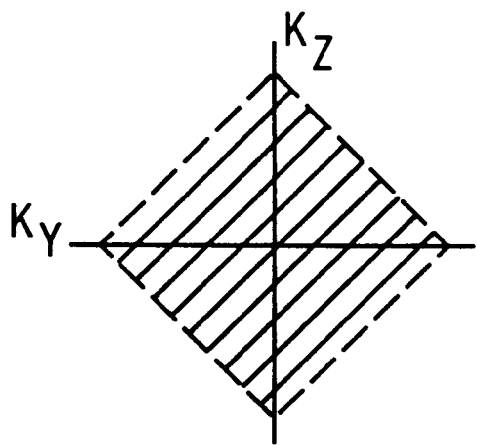
Figure 10D:
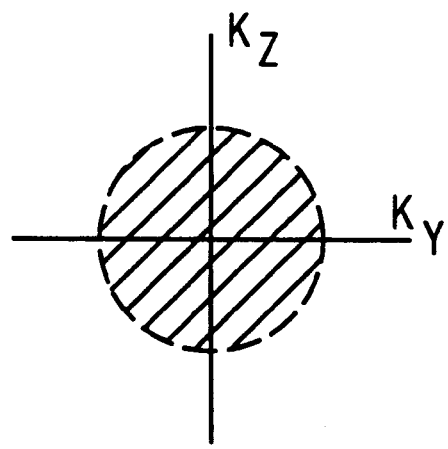

Two symmetrical k-space sampling shapes are illustrated in FIGS. 10c and 10d. Both the diamond sampling shape of FIG. 10c and the circular sampling shape of FIG. 10d provide higher resolution images than the key-hole sampling shape of FIG. 10a. In addition, because they are symmetrical about the origin of k-space, phase correction and the possible image artifacts associated with such corrections may not be required. The unsampled "corners" of k-space are zero-filled before the image is reconstructed. After all the fields of view have been acquired and the scan is completed, the acquired field of view images are registered with each other and combined to form a single image of the much larger region of interest. The patient is immobilized to the table 256 with straps (not shown) to minimize misregistration between the field of view images. In addition, a marker made of a contrast agent solution which produces a high level signal can be placed along side the patient and used to align each field of view image such that they are in registration with each other and form a single, contiguous image of the entire region of interest.

Figure 5:
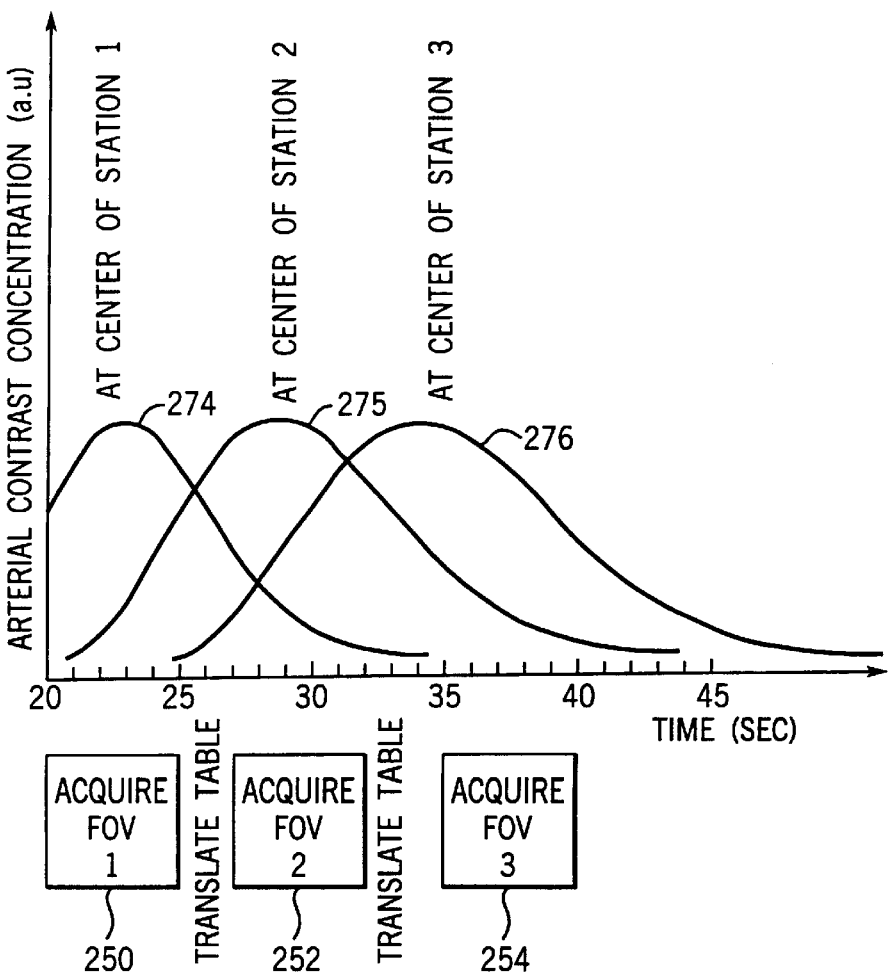
FIG. 5 is a graphic representation of the contrast bolus curve.

In the preferred method the acquisition of each FOV is timed to occur when maximum image contrast is produced by a contrast agent administered intravenously to the patient. A test bolus (eg. 5 ml of gadolinium) is administered intravenously to measure the bolus timing curve at a predetermined region of interest, typically the second FOV. As shown in FIG. 5, for example, the curve 274 peaks in the first FOV 250 at approximately 23 seconds after the contrast agent is administered, the curve 275 peaks in the second FOV 252 at approximately 29 seconds after the contrast agent is administered and the curve 276 peaks in the third FOV 254 at approximately 35 seconds after contrast administration. This establishes when the data should be acquired for best image contrast. In the preferred embodiment the data acquisition is timed to begin such that when the first FOV has been completely acquired, the onset of the contrast peak has reached the second FOV for a few seconds.

As is well known in the art, "mask" images may also be acquired before contrast agent is administered. In the preferred embodiment, the mask images are acquired before bolus injection at each of the stations. The above described contrast enhanced acquisition is then performed and a complex subtraction of corresponding voxels in the mask image from the reconstructed image is performed to further enhance image quality.

The preferred method for practicing the invention includes conducting a "scout scan" to confirm that the vasculature of interest is within the FOV of at least one of the stations. This is followed by a "timing scan" in which information is acquired regarding the arrival of the contrast agent bolus, and by a "mask scan" in which the mask image data is acquired. And finally, the "bolus tracking MRA scan" is conducted as described above and shown in FIG. 6. The following is an exemplary procedure for carrying out these steps in a four station scan of a patient's legs.

Scout Scan

A multiple location, sagittal acquisition using a 2D fast gradient echo sequence (FOV=40 cm, TE/TR=2/9, receiver bandwidth=16 kHz, 256×256, 1/2 FOV, total acquisition time~15 sec) is performed at the first station. The patient is translated to the second station and the same scan is repeated immediately without any prescan. This process repeats until all stations are imaged. For a 4-station scout scan, the total imaging time is about 70 sec (allowing 10 seconds for each table motion).

Timing Scan

A thick coronal slab timing acquisition is typically performed at the second station using a gadolinium contrast agent test dose (3–5 mL, at 1 mL/sec injection rate followed with a 20 mL saline flush at 1 mL/sec.) and a 2D fast gradient echo sequence (FOV=32–40 cm, 80–140 mm thick, TE/TR=2/9, flip angle=50°, receiver bandwidth=16 kHz, k-space sampling matrix=256×160–192, 30–40 image frames, total acquisition time~45–60 sec. to ensure the capture of the contrast peak). From this timing acquisition, the arrival time of the contrast agent in the FOV is measured.

Mask Scan

Similar to the bolus tracking scan described next, except no contrast agent is injected. The same pulse sequence parameters and the same table movement sequence are used.

Bolus Tracking MRA Scan

The contrast agent is administered and a scan is conducted using the fast 3D gradient echo sequence described above. Each 3D acquisition of a FOV was completed in 14 seconds using the following imaging parameters: TR/TE=4.5/1, flip angle=45°, matrix=256×192×32, FOV=48 cm with 1/2 FOV along phase (y) direction, receiver bandwidth=62.5 kHz. Total slab thickness ranged between 120–140 mm, resulting in individual slice thickness of 4–5 mm. An automatic delay upon completion of each FOV acquisition was included. Following each FOV acquisition the table was advanced to the next station and the next FOV acquisition was started as soon as the table came to a full stop. There was approximately 2 seconds between stations, resulting in a 3-station acquisition time of 46 seconds.

Contrast infusion was performed via a 22 gauge catheter placed in an antecubital fossa vein. An MR specific power injector was used. Contrast dose of 25 mL (Gadodiomide, Omniscan, Nycomed, Princeton, N.J.) was infused 1 mL/sec. The contrast infusion was followed immediately by a 20 mL saline flush at 1 mL/sec.

The patient was instructed to remain motionless between the mask and bolus tracking acquisitions (less than 2 min). The patient was also instructed to hold his/her breath during acquisition of the first FOV during both the mask and the bolus acquisitions. Adequate foam rubber and Velcro straps were used to immobilize the patient. After completion of the mask acquisition, the table was returned to its initial position and contrast infusion was started. Timing for contrast infusion and bolus tracking data acquisition were determined in the following manner. Data acquisition for the first FOV ended when the contrast peak had reached the second FOV for 5 seconds. The delay between the start of contrast injection and the start of the first FOV acquisition was thus set according to the timing scan measurement, plus 5 seconds and minus 14 seconds required to acquire the NMR data from the first FOV. A pause (approximately 2 seconds) was taken between stations to translate the patient to the next station, and the next acquisition was started immediately.

Other data processing techniques may be used to generate angiograms. Methods other than complex subtraction, such as digital filters, may be used to generate angiograms. The criteria for digital filter design is to extract dynamic contrast (or signal variation) from a temporal series of images, and vessel contrast is determined by this dynamic contrast. For example, matched filters can be used to generate an angiogram that is a sum of individual arteriograms generated by complex subtraction.

Another application for the invention is to image the aorta in the body trunk. The aortic arch and the abdominal aorta can be imaged in two separate FOVs using a fast 3D acquisition technique and contrast infusion.

What is claimed is:

1. A method for producing an image with an MRI system, the steps comprising:
   a) positioning a patient in the MRI system;
   b) acquiring NMR image data from the patient over a first field of view using an NMR pulse sequence in which imaging gradients are changed to sample a first k-space which is tailored in size and shape in a first predetermined sampling scheme;
   c) translating the patient in the MRI system;
   d) acquiring NMR image data from the patient over a second field of view using an NMR pulse sequence in which imaging gradients are changed to sample a second k-space which is tailored in size and shape that is different than said first k-space in a second predetermined sampling scheme; and
   e) registering the NMR image data acquired over the first and second fields of view and reconstructing an image over a region of interest which includes the first and second fields of view.

2. The method as recited in claim 1 in which the k-space sampling performed in step b) is performed in a descending order and the k-space sampling performed in step d) is performed in an ascending order.

3. The method as recited in claim 2 which includes:
   administering a contrast agent to the patient; and
   timing the performance of steps b) and d) such that the contrast agent provides substantial signal enhancement when sampling said first k-space and said second k-space.

4. The method as recited in claim 3 in which the NMR pulse sequences used in steps b) and d) are three-dimensional NMR pulse sequences.

5. The method as recited in claim 1 in which the first k-space and the second k-space are tailored from a set of sampling shapes including:
   asymmetric; diamond; and circular.

6. A method for producing an image with an MRI system, the steps comprising:
   a) positioning a patient in the MRI system;
   b) acquiring NMR image data from the patient over a first field of view using an NMR pulse sequence in which imaging gradients are changed to sample in descending order a first k-space which is tailored in size and shape;
   c) translating the patient in the MRI system;
   d) acquiring NMR image data from the patient over a second field of view using an NMR pulse sequence in which imaging gradients are changed to sample in ascending order a second k-space which is tailored in size and shape differently than said first k-space; and
   e) registering the NMR image data acquired over the first and second fields of view and reconstructing an image over a region of interest which includes the first and second fields of view.

7. The method as recited in claim 6 which includes:
   administering a contrast agent to the patient; and
   timing the performance of steps b) and d) such that the contrast agent provides substantial signal enhancement when sampling said first k-space and said second k-space.

8. The method as recited in claim 7 in which the NMR pulse sequences used in steps b) and d) are three-dimensional NMR pulse sequences.

9. The method as recited in claim 6 in which the first k-space and the second k-space are tailored from a set of sampling shapes including:
   asymmetric; diamond; and circular.

* * * * *